US010250012B2

(12) United States Patent
Barve et al.

(10) Patent No.: US 10,250,012 B2
(45) Date of Patent: Apr. 2, 2019

(54) VARIABLE EMISSION AREA DESIGN FOR A VERTICAL-CAVITY SURFACE-EMITTING LASER ARRAY

(71) Applicant: Lumentum Operations LLC, Milpitas, CA (US)

(72) Inventors: Ajit Vijay Barve, San Jose, CA (US); Eric R. Hegblom, Sunnyvale, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 15/171,844

(22) Filed: Jun. 2, 2016

(65) Prior Publication Data

US 2017/0353012 A1 Dec. 7, 2017

(51) Int. Cl.
*H01S 5/42* (2006.01)
*H01S 5/183* (2006.01)

(52) U.S. Cl.
CPC .......... *H01S 5/423* (2013.01); *H01S 5/18311* (2013.01); *H01S 5/18344* (2013.01); *H01S 5/18394* (2013.01)

(58) Field of Classification Search
CPC .... H01S 5/4087; H01S 5/423; H01S 5/18308; H01S 5/18311; H01S 5/18344; H01S 5/18394
See application file for complete search history.

(56) References Cited

U.S. PATENT DOCUMENTS

| 5,719,891 | A | | 2/1998 | Jewell | |
|---|---|---|---|---|---|
| 5,978,408 | A | * | 11/1999 | Thornton | H01S 5/18338 372/45.01 |
| 2005/0019973 | A1 | * | 1/2005 | Chua | H01S 5/423 438/42 |
| 2006/0007979 | A1 | * | 1/2006 | Jikutani | B82Y 20/00 372/92 |
| 2006/0285568 | A1 | * | 12/2006 | Watanabe | B82Y 20/00 372/50.121 |
| 2010/0035372 | A1 | * | 2/2010 | Gauggel | H01S 5/423 438/34 |

* cited by examiner

*Primary Examiner* — Tod T Van Roy
(74) *Attorney, Agent, or Firm* — Harrity & Harrity, LLP

(57) ABSTRACT

A vertical cavity surface emitting laser (VCSEL) array may include a plurality of VCSELs. A size of an emission area of a first VCSEL, of the plurality of VCSELs, may be different from a size of an emission area of a second VCSEL of the plurality of VCSELs. The first VCSEL may be located closer to a center of the VCSEL array than the second VCSEL. A difference between the size of the emission area of the first VCSEL and the size of the emission area of the second VCSEL may be associated with reducing a difference in operating temperature between the first VCSEL and the second VCSEL, or reducing a difference in optical power output between the first VCSEL and the second VCSEL.

19 Claims, 6 Drawing Sheets

VARIABLE EMISSION AREA DESIGN FOR A VERTICAL-CAVITY SURFACE-EMITTING LASER ARRAY

TECHNICAL FIELD

The present disclosure relates generally to lasers and, more particularly, to a variable emission area design for a vertical-cavity surface-emitting laser (VCSEL) array.

BACKGROUND

A vertical-emitting device, such as a vertical-cavity surface-emitting laser (VCSEL), is a laser in which a laser beam is emitted in a direction perpendicular to a surface of a substrate (e.g., vertically from a surface of a semiconductor wafer). Contrary to edge-emitting devices, vertical-emitting devices may allow for testing to occur at intermediate steps of wafer fabrication.

SUMMARY

According to some possible implementations, a vertical cavity surface emitting laser (VCSEL) array may include: a plurality of VCSELs, where a size of an emission area of a first VCSEL, of the plurality of VCSELs, is different from a size of an emission area of a second VCSEL of the plurality of VCSELs, where the first VCSEL may be located closer to a center of the VCSEL array than the second VCSEL, and where a difference between the size of the emission area of the first VCSEL and the size of the emission area of the second VCSEL is associated with reducing a difference in operating temperature between the first VCSEL and the second VCSEL, or reducing a difference in optical power output between the first VCSEL and the second VCSEL.

According to some possible implementations, an emitter array may include: a plurality of emitters, where an emission area size of a first emitter, of the plurality of emitters, is different from an emission area size of a second emitter of the plurality of emitters, where the first emitter may be located closer to an edge of the emitter array than the second emitter, and where a difference between the emission area size of the first emitter and the emission area size of the second emitter is associated with improving reducing operating temperature non-uniformity between the first emitter and the second emitter or reducing optical power non-uniformity between the first emitter and the second emitter.

According to some possible implementations, a laser array may include: a first vertical emitting device, where the first vertical emitting device has an emission area of a first size; and a second vertical emitting device, where the second vertical emitting device has an emission area of a second size, where the second size may be larger than the first size, or the second size may be smaller than the first size, where the first vertical emitting device may be located closer to a center of the laser array than the second vertical emitting device, and where a difference between the first size and the second size is related to reducing operating temperature non-uniformity between the first vertical emitting device and the second vertical emitting device, or reducing optical power non-uniformity between the first vertical emitting device and the second vertical emitting device.

DETAILED DESCRIPTION

Figure 1:
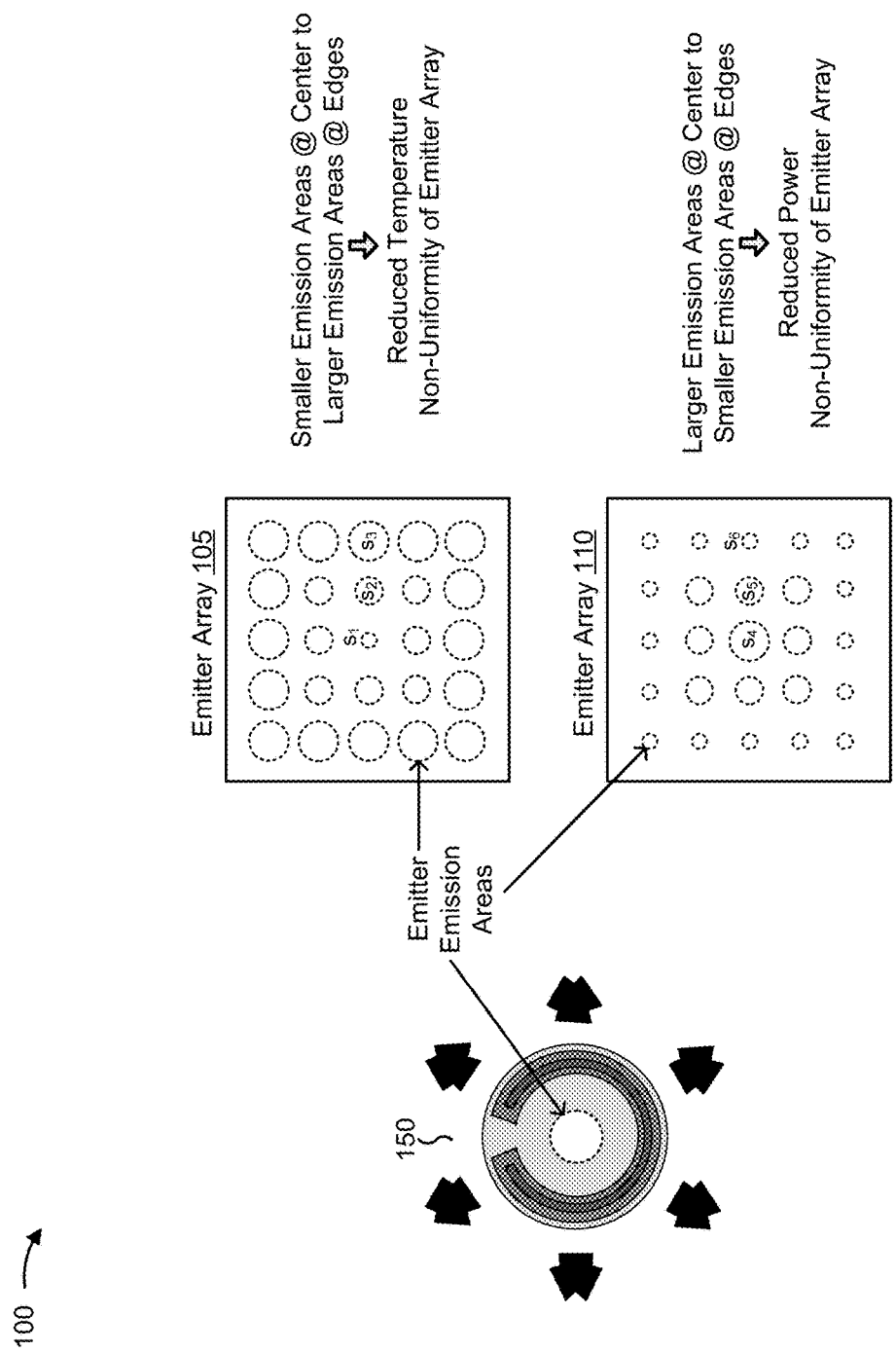
FIG. 1 is a diagram of an overview of example implementations described herein.

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations.

Multiple vertical-emitting devices (e.g., VCSELs) may be arranged to form an array. For example, multiple vertical-emitting devices (herein referred to as emitters) may be arranged to form an emitter array (e.g., a VCSEL array), such as a grid emitter array (e.g., where multiple emitters are uniformly spaced and oxidation trenches may be shared by two or more emitters), a non-grid emitter array (e.g., where multiple emitters are not uniformly spaced and each emitter requires a set of oxidation trenches which may or may not be shared), or the like.

Typically, a given emitter array includes emitters with a same emission area size (e.g., where the emission area of a given emitter corresponds to a diameter or width of a current confinement aperture of the emitter). In such a case, emitters closer to a center of the emitter array are surrounded by a greater number of emitters than those closer to edges of the emitter array. As such, during operation of the emitter array, the emitters closer to the center of the emitter array have less area to dissipate heat than the emitters closer to the edges of the emitter array. Thus, the heat generated by the emitters close to the center of the emitter array may be forced to dissipate through a substrate beneath the emitters, thereby causing higher operating temperature of the emitters closer to the center of the emitter array (e.g., as compared to the emitters closer to the edges of the emitter array).

In some cases, reliability of the emitter array may be negatively impacted due such temperature non-uniformity. For example, due the temperature non-uniformity, the emitter array may have an increased risk of failure, since the emitters closer to the center of the emitter experience increased stress conditions as a result of the higher temperature. Additionally, a non-uniformity in temperature may also lead to a non-uniformity in wavelength across the array, since refractive indices of typical semiconductor materials used to make emitters are temperature sensitive. For example, such a temperature non-uniformity may cause a change in the emitter lasing wavelength by approximately 0.06 nanometers (nm) per degree Celsius. Thus, a wavelength range of a few nanometers is possible across an emitter array (e.g., based on typical thermal characteristics and sizes). Such a wavelength non-uniformity is not desirable for some applications, such as an application that relies on filtering a wavelength of light at a photo-sensor. Here, a large spectral width of the emitter array may need a center lasing wavelength to be more tightly controlled, which may be difficult to yield in practice.

Implementations described herein may provide an emitter array designed to improve reliability of the emitter array by reducing temperature non-uniformity across the emitter array (i.e., decreasing a temperature difference across the emitter array).

Additionally, optical power of the emitter array may be negatively impacted due to the higher operating temperature of the emitters closer to the center of the emitter array. For example, for a given amount of current, optical power of an emitter operating at a higher operating temperature is less than optical power of the emitter operating at a comparatively lower operating temperature. In other words, the emitter is less efficient when operating at the higher temperature, thereby causing reduced optical power. In the case of the emitter array, the emitters closer to the center of the emitter array may have reduced optical power due to the increased heating. As such, the emitter array may experience non-uniformity of optical power and/or reduced optical power. Implementations described herein may provide an emitter array designed to improve optical power of the emitter array by reducing power non-uniformity across the emitter array.

Moreover, the emitter arrays described herein (e.g., the emitter array designed to improve reliability by reducing temperature non-uniformity, the emitter array designed to improve optical power by reducing power non-uniformity), typically have emitters designed to produce an output (e.g., a laser, light, an emission) with a same wavelength (e.g., in absence of any temperature variation). In practice, the emitters of the described emitter arrays may produce outputs with a substantially same wavelength (e.g., outputs with wavelengths that vary from a given wavelength by less than or equal to 6 nm), where nominal variations in the wavelengths may exist among the emitters due to, for example, epitaxy and/or fabrication variations, heating, or the like. The implementations described herein associated with reducing a temperature gradient across the emitter array may also reduce wavelength spread (i.e., spectral width) of the emitter array. Additionally, the emitters of the described emitter arrays may be fabricated at a same time on a single wafer and/or chip, and may be tested at wafer level.

FIG. 1 is a diagram of overviews of example implementations 105 and 110 described herein. As shown in the left portion of FIG. 1, emitter 150 may include a set of emitter layers constructed in a typical emitter architecture. For purposes of clarity, not all emitter layers of emitter 150 are shown in FIG. 1. Additional details regarding emitter layers of emitter 150 are described with regard to FIG. 2. As noted, an emission area of emitter 150 may be located at approximately a center of emitter 150. In some implementations, a size (e.g., a diameter, a width) of the emission area of emitter 150 may correspond to a size (e.g., a diameter, a width) of a current confinement aperture of emitter 150, as described in further detail with regard to FIG. 2.

As further shown in FIG. 1, emitters 150 may be arranged to form an emitter array, such as emitter array 105 or emitter array 110. For purposes of clarity, only emission areas of emitters 150 included in emitter array 105 and emitter array 110 are shown in FIG. 1.

As shown with respect to emitter array 105, an emission area of a first emitter 150 may be located at approximately a center of emitter array 105 and may be a first size (e.g., $s_1$). As shown, second emitters 150 of a group of emitters 150 (herein individually referred to as a second emitter 150) may be arranged in an inner set that surrounds the first emitter 150. Here, a second emitter 150 may have an emission area of a second size that is larger than the first size (e.g., $s_2 > s_1$).

As further shown, third emitters 150 of another group of emitters 150 (herein individually referred to as a third emitter 150) may be arranged in an outer set that surrounds the inner set of emitters 150. Here, a third emitter 150 may have an emission area of a third size that is larger than the second size (e.g., $s_3 > s_2$). In other words, emission areas of emitters 150 included in emitter array 105 may increase in size from the center of emitter array 105 (e.g., the first emitter 150) to edges of emitter array 105 (e.g., the third emitters 150 in the outer set).

Notably, while emitter array 105 includes an emitter 150 with a smallest emission area (e.g., the first emitter 150) positioned at an approximate center of emitter array 105, in some implementations, another arrangement of emitters 150 is possible such that an emitter 150 with the smallest emission area are not positioned at the approximate center of emitter array 105. In some implementations, the arrangement of emitters 150 with varying emission area sizes may depend on the particular arrangement of emitters 150 and/or a density of emitters 150 within emitter array 105. For example, if the density of emitters 150 varies across emitter array 105, then a location of increased heating within emitter array 105 may be at a position other than the approximate center of emitter array 105. In this example, emitter 150 with the smallest emission area may be positioned approximately at the location of increased heating (i.e., not at the approximate center of emitter array 105).

As noted, the design of emitter array 105 may reduce temperature non-uniformity across emitter array 105. For example, due to the emission area of the first emitter 150 being of a smaller size than the emission area of the second emitter 150, the first emitter 150 may consume less current than the second emitter 150. This occurs since emitters 150 may be driven in parallel with a common current source, and a resistance of each emitter 150 increases as a size of a current confinement aperture (e.g., an oxide aperture, an etched mesa, a region without ion implantation, or the like) is reduced, thereby reducing current consumption. Thus, the first emitter 150 may operate at a lower temperature than a temperature at which the first emitter 150 would operate if the emission area of the first emitter 150 was the second size (i.e., a substantially same size as the emission area of the second emitter 150). In other words, due to the emission area size differences, the operating temperature of the first emitter 150 may more closely match the operating temperature of the second emitter 150.

Similarly, due to the emission area of the third emitter 150 being of a larger size than the emission area of the second emitter 150, the third emitter 150 may consume more current than the second emitter 150 and, thus, may operate at a higher temperature than a temperature at which the third emitter 150 would operate if the emission area of the third emitter 150 was the second size (i.e., a substantially same size as the emission area of the second emitter 150). In other words, due to the emission area size differences, the operating temperature of the third emitter 150 may more closely match the operating temperature of the second emitter 150.

Here, increasing the size of the emission area of emitters 150 from the center of emitter array 105 to edges of emitter array 105 may reduce temperature non-uniformity across emitter array 105 (e.g., as compared to an emitter array including emitters with a same emission area size), thereby improving reliability of emitter array 105 and/or emitters 150 included in emitter array 105. In some implementations, a size variation of emission areas and/or a number of different sizes of emission areas included in emitter array 105 may depend on one or more factors, such as conditions under which emitter array 105 is expected to operate, a number of emitters 150 in emitter array 105, a design of emitter array 105, or the like.

As shown with respect to emitter array 110, an emission area of a fourth emitter 150 may be located at approximately a center of emitter array 110 and may be a fourth size (e.g., $s_4$). As shown, fifth emitters 150 of a group of emitters 150 (herein individually referred to as a fifth emitter 150) may be arranged in an inner set that surrounds the fourth emitter 150. Here, a fifth emitter 150 may have an emission area of a fifth size that is smaller than the fourth size (e.g., $s_5 < s_4$). As further shown, sixth emitters 150 of another group of emitters 150 (herein individually referred to as a sixth emitter 150) may be arranged in an outer set that surrounds the inner set of emitters 150. Here, a sixth emitter 150 may have an emission area of a sixth size that is smaller than the fifth size (e.g., $s_6 < s_5$). In other words, emission areas of emitters 150 included in emitter array 110 may decrease in size from the center of emitter array 110 (e.g., the fourth emitter 150) to edges of emitter array 110 (e.g., the sixth emitters in the outer set).

As noted, the design of emitter array 110 may reduce optical power non-uniformity across emitter array 110. For example, due to the emission area of the fourth emitter 150 being of a larger size than the emission area of the fifth emitter 150, the fourth emitter 150 may consume more current than the fifth emitter 150. This occurs since emitters 150 may be driven in parallel with a common current source, and a resistance of each emitter 150 decreases as a size of a current confinement aperture is increased, thereby increasing current consumption. Thus, the fourth emitter 150 may output a greater amount of optical power than an amount of optical power that the fourth emitter 150 would output if the emission area of the fourth emitter 150 was the fifth size (i.e., a substantially same size as the emission area of the fifth emitter 150).

Similarly, due to the emission area of the sixth emitter 150 being of a smaller size than the emission area of the fifth emitter 150, the sixth emitter 150 may consume less current than the fifth emitter 150 and, thus, may output a smaller amount of optical power than the sixth emitter 150 would output if the emission area of the sixth emitter 150 was the fifth size (i.e., a substantially same size as the emission area of the fifth emitter 150). Here, decreasing the size of the emission area of emitters 150 from the center of emitter array 110 to edges of emitter array 110 may reduce optical power non-uniformity across emitter array 110 (e.g., as compared to an emitter array including emitters with a same emission area size), thereby improving power output of emitter array 110.

In some implementations, a size variation of emission areas and/or a number of different sizes of emission areas included in emitter array 110 may depend on one or more factors, such as conditions under which emitter array 110 is expected to operate, a number of emitters 150 in emitter array 110, a design of emitter array 110, or the like.

Notably, the size variations for emitter arrays described herein are associated with reducing temperature non-uniformity across an emitter array or reducing optical power non-uniformity across the emitter array, rather than to address manufacturability concerns associated with the emitter array. For example, varying aperture sizes of smaller emitters in an emitter array may be used to compensate for variations in thickness of an epitaxial layer of the emitter array that cause wavelength non-uniformity among outputs of emitters. However, such manufacturability concerns arise for emitter arrays that include smaller emitters (e.g., emitters with aperture sizes that are less than approximately 5 microns in diameter), whereas these concerns do not typically apply to emitter arrays that include larger emitters (e.g., emitters with apertures sizes that are greater than or equal to approximately 6 micrometers). In other words, for emitter arrays with larger, closely spaced emitters, variations in emitter performance caused to due to manufacturing issues may be negligible and, thus, need not be corrected by emitter size variation. As such, the implementations described herein include varying emitter aperture size of larger emitters to address a temperature gradient associated with an emitter array or an optical power gradient associated with the emitter array, in order to improve reliability of the emitter array.

As indicated above, FIG. 1 is provided merely as an example. In practice, emitter arrays 105 and/or 110 may include additional emitters 150, fewer emitters 150, or differently arranged emitters 150 than those shown in FIG. 1. For example, emitter arrays 105 and/or 110 may include emitters 150 arranged in a grid array, a non-grid array, randomly spaced emitters 150, or the like. Additionally, emitter arrays 105 and/or 110 may include additional and/or different variations, patterns, distributions, and/or sizes of emission areas than those shown in FIG. 1.

Additionally, the design of emitter array 105 may be combined with the design of emitter array 110 in order to reduce both temperature non-uniformity and optical power non-uniformity. For example, emission area sizes may increase from a center toward a first edge for a first group of emitters 150 included an emitter array, while emission area sizes may decrease from the center toward a second edge for a second group of emitters included in the emitter array.

Figure 2A:
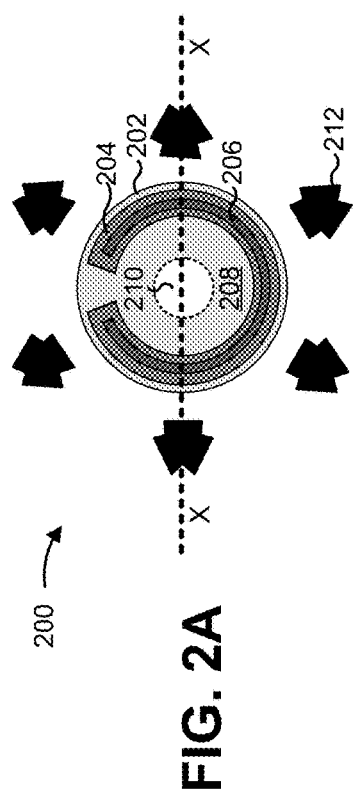
FIGS. 2A and 2B are diagrams depicting a top-view of an example emitter and an example cross-sectional view of the example emitter, respectively.
Figure 2B:
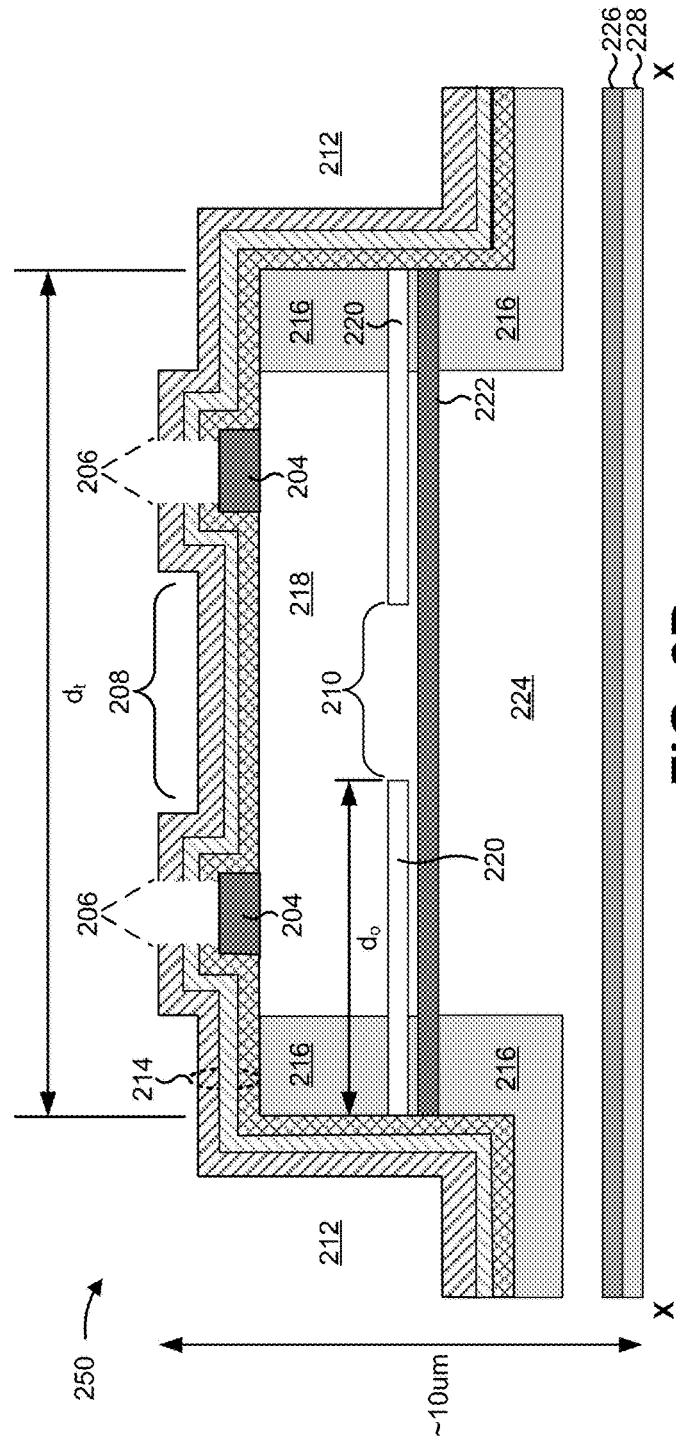

FIGS. 2A and 2B are diagrams depicting a top-view 200 of emitter 150 and an example cross-sectional view 250 of emitter 150, respectively. As shown in FIG. 2A, emitter 150 may include a set of emitter layers constructed in a typical emitter architecture. For purposes of clarity, not all emitter layers of emitter 150 are shown in FIG. 2A.

As shown by the light gray area in FIG. 2A, emitter 150 includes an implant protection layer 202 that is circular in shape in this example. In some implementations, implant protection layer 202 may have another shape, such as an elliptical shape, a polygonal shape, or the like. Implant protection layer 202 is defined based on a space between sections of implant material included in emitter 150 (not shown). As shown by the medium gray area in FIG. 2A, emitter 150 includes a P-Ohmic metal layer 204 that is constructed in a partial ring-shape (e.g., with an inner radius and an outer radius). As shown, P-Ohmic metal layer 204 is positioned concentrically over implant protection layer 202 (i.e., the outer radius of P-Ohmic metal layer 204 is less than or equal to the radius of implant protection layer 202). Such configuration may be used, for example, in the case of a P-up/top-emitting emitter 150. In the case of a bottom-emitting emitter 150, the configuration may be adjusted as needed.

As shown by the dark gray area of FIG. 2A, emitter 150 includes a dielectric via opening 206 that is formed (e.g., etched) on a dielectric passivation/mirror layer that covers P-Ohmic metal layer 204 (not shown). As shown, dielectric via opening 206 is formed in a partial ring-shape (e.g., similar to P-Ohmic metal layer 204) and is formed concentrically over P-Ohmic metal layer 204 such that metallization of the dielectric passivation/mirror layer contacts P-Ohmic metal layer 204. In some implementations, dielectric opening 206 and/or P-Ohmic metal layer 204 may be formed in another shape, such as a full ring-shape or a split ring-shape.

As further shown, emitter 150 includes an optical aperture 208 in a portion of the emitter within the inner radius of the partial ring-shape of P-Ohmic metal layer 204. Emitter 150 emits a laser beam via optical aperture 208. As further shown, emitter 150 also includes a current confinement aperture 210 (e.g., an oxide aperture formed by an oxidation layer of emitter 150 (not shown)). Current confinement aperture 210 is formed below optical aperture 208.

As shown by the black irregular shapes in FIG. 2A, emitter 150 includes a set of oxidation trenches 212 that are spaced (e.g., equally, unequally) around a circumference of implant protection layer 202. How close oxidation trenches 212 can be positioned relative to the optical aperture 208 is dependent on the application, and is typically limited by implant protection layer 202, P-Ohmic metal layer 204, dielectric via opening 206, and manufacturing tolerances.

The number and arrangement of layers shown in FIG. 2A are provided as an example. In practice, emitter 150 may include additional layers, fewer layers, different layers, or differently arranged layers than those shown in FIG. 2A. For example, while emitter 150 includes a set of six oxidation trenches 212, in practice, other designs are possible, such as a compact emitter that includes five oxidation trenches 212, seven oxidation trenches 212, or the like. As another example, while emitter 150 is a circular emitter design, in practice, other designs are possible, such as a rectangular emitter, a hexagonal emitter, an elliptical emitter, or the like. Additionally, or alternatively, a set of layers (e.g., one or more layers) of emitter 150 may perform one or more functions described as being performed by another set of layers of emitter 150, respectively.

Notably, while the design of emitter 150 is described as including a VCSEL, other implementations are possible. For example, the design of emitter 150 may apply in the context of another type of optical device, such as a light emitting diode (LED), or another type of vertical emitting (e.g., top emitting or bottom emitting) optical device. Additionally, the design of emitter 150 may apply to emitters of any wavelength, power level, emission profile, or the like. In other words, emitter 150 is not particular to an emitter with a given performance characteristic.

As shown in FIG. 2B, example cross-sectional 200 view may represent a cross-section of emitter 150 that passes through a pair of oxidation trenches 212 (e.g., as shown by the line labeled "X-X" in FIG. 2A). As shown, emitter 150 may include a backside cathode layer 228, a substrate layer 226, a bottom mirror 224, an active region 222, an oxidation layer 220, a top mirror 218, implant isolation material 216, dielectric passivation/mirror layer 214, and P-Ohmic metal layer 204. As shown, emitter 150 may have a total height that is approximately 10 µm.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, such as a GaAs layer, an InP layer, or the like.

Bottom mirror 224 may include a bottom reflector layer of emitter 150. For example, bottom mirror 224 may include a distributed Bragg reflector (DBR).

Active region 222 may include a layer that confines electrons and defines an emission wavelength of emitter 150. For example, active region 222 may be a quantum well.

Oxidation layer 220 may include an oxide layer that provides optical and electrical confinement of emitter 150. In some implementations, oxidation layer 220 may be formed as a result of wet oxidation of an epitaxial layer. For example, oxidation layer 220 may be an $Al_2O_3$ layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed. In some implementations, a distance between oxidation trenches 212 may be varied among emitters 150 to cause emission area sizes of emitters 150 to vary across an emitter array, as described below.

Current confinement aperture 210 may include an optically active aperture defined by oxidation layer 220. A size of current confinement aperture 210 may range, for example, from approximately 6.0 µm to approximately 14.0 In some implementations, a size of current confinement aperture 210 may depend on a distance between oxidation trenches 212 that surround emitter 150. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as $d_o$ in FIG. 2B) toward a center of emitter 150, thereby forming oxidation layer 220 and oxidation aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, or the like.

As such, varying a distance between oxidation trenches 212 (e.g., identified as $d_t$ in FIG. 2B) may allow the size of current confinement aperture 210 to be different between emitters 150 (e.g., since distance $d_o$ may not change). For example, a size of current confinement aperture 210 in a first emitter 150 with a first (e.g., larger) distance $d_t$ may be larger than a size of current confinement aperture 210 in a second emitter 150 with a second (e.g., smaller) distance $d_t$. In other words, a larger distance $d_t$ between oxidation trenches 212 may cause a larger size of current confinement aperture 210, while a relatively smaller distance $d_t$ may cause a smaller size of current confinement aperture 210. In some implementations, the size of current confinement aperture 210 may define an emission area of emitter 150. In some implementations, sizes of current confinement apertures 210 in emitters 150 included in an emitter array may vary in order to cause emitters 150 to have different emission area sizes across the emitter array, as described elsewhere herein.

Top mirror 218 may include a top reflector layer of emitter 150. For example, top mirror 218 may include a DBR.

Implant isolation material 216 may include a material that provides electrical isolation. For example, implant isolation material 216 may include an ion implanted material, such as an H implanted material or a Hydrogen/Proton implanted material. In some implementations, implant isolation material 216 may define implant protection layer 202.

Dielectric passivation/mirror layer 214 may include a layer that acts as a protective passivation layer and that acts as an additional DBR. For example, dielectric passivation/mirror layer 214 may include one or more sub-layers (e.g., a SiO$_2$ layer, a Si$_3$N$_4$ layer) deposited (e.g., via chemical vapor deposition) on one or more other layers of emitter 150.

As shown, dielectric passivation/mirror layer 214 may include one or more dielectric via openings 206 that provide electrical access to P-Ohmic metal layer 204. Optical aperture 208 may include a portion of dielectric passivation/mirror layer 214 over current confinement aperture 210 via which light may be emitted.

P-Ohmic metal layer 204 may include a layer that makes electrical contact via which electrical current may flow. For example, P-Ohmic metal layer 204 may include a TiAu layer, a TiPtAu layer, or the like, via which electrical current may flow (e.g., via a bondpad (not shown) that contacts P-Ohmic metal layer 204 through dielectric via openings 206).

In some implementations, emitter 150 may be manufactured using a series of steps. For example, bottom mirror 224, active region 222, oxidation layer 220, and top mirror 218 may be epitaxially grown on substrate layer 226, after which P-Ohmic metal layer 204 may be deposited on top mirror 218. Next, oxidation trenches 212 may be etched (e.g., to expose oxidation layer 220 for oxidation). Implant protection material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B is provided as an example. In practice, emitter 150 may include additional layers, fewer layers, different layers, differently constructed layers, or differently arranged layers than those shown in FIG. 2B. Additionally, or alternatively, a set layers (e.g., one or more layers) of emitter 150 may perform one or more functions described as being performed by another set of layers of emitter 150.

Figure 3A:
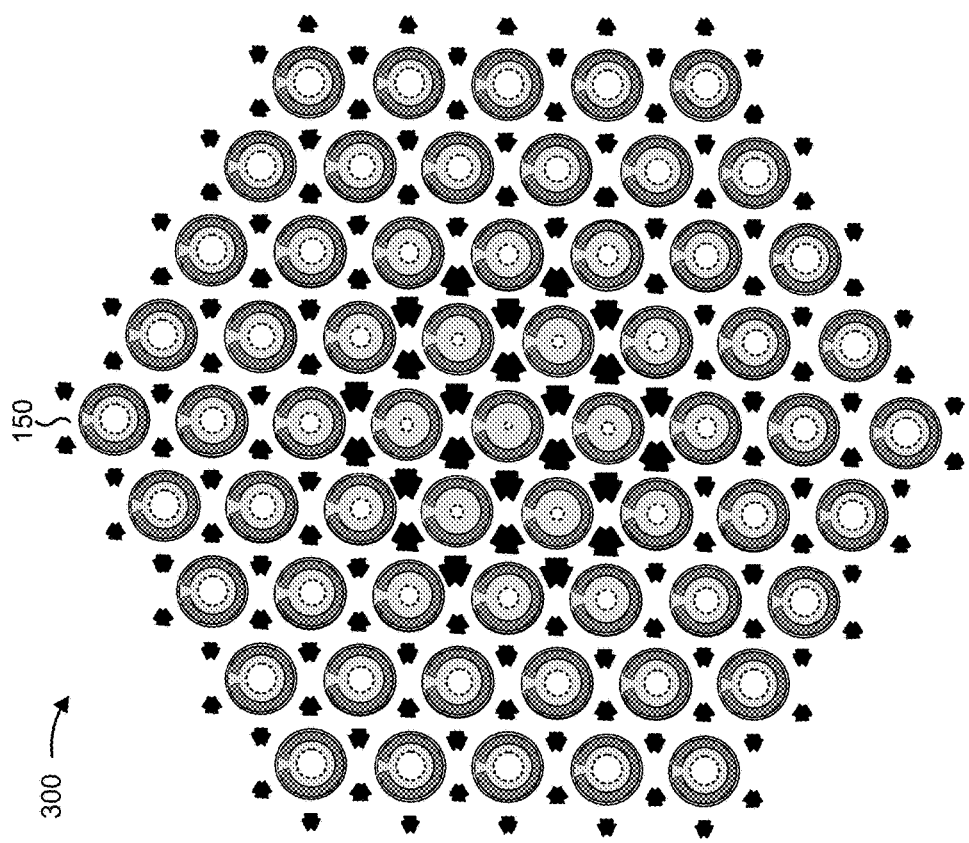
FIGS. 3A and 3B are diagrams associated with an example emitter array designed to reduce temperature non-uniformity in the example emitter array.
Figure 3B:
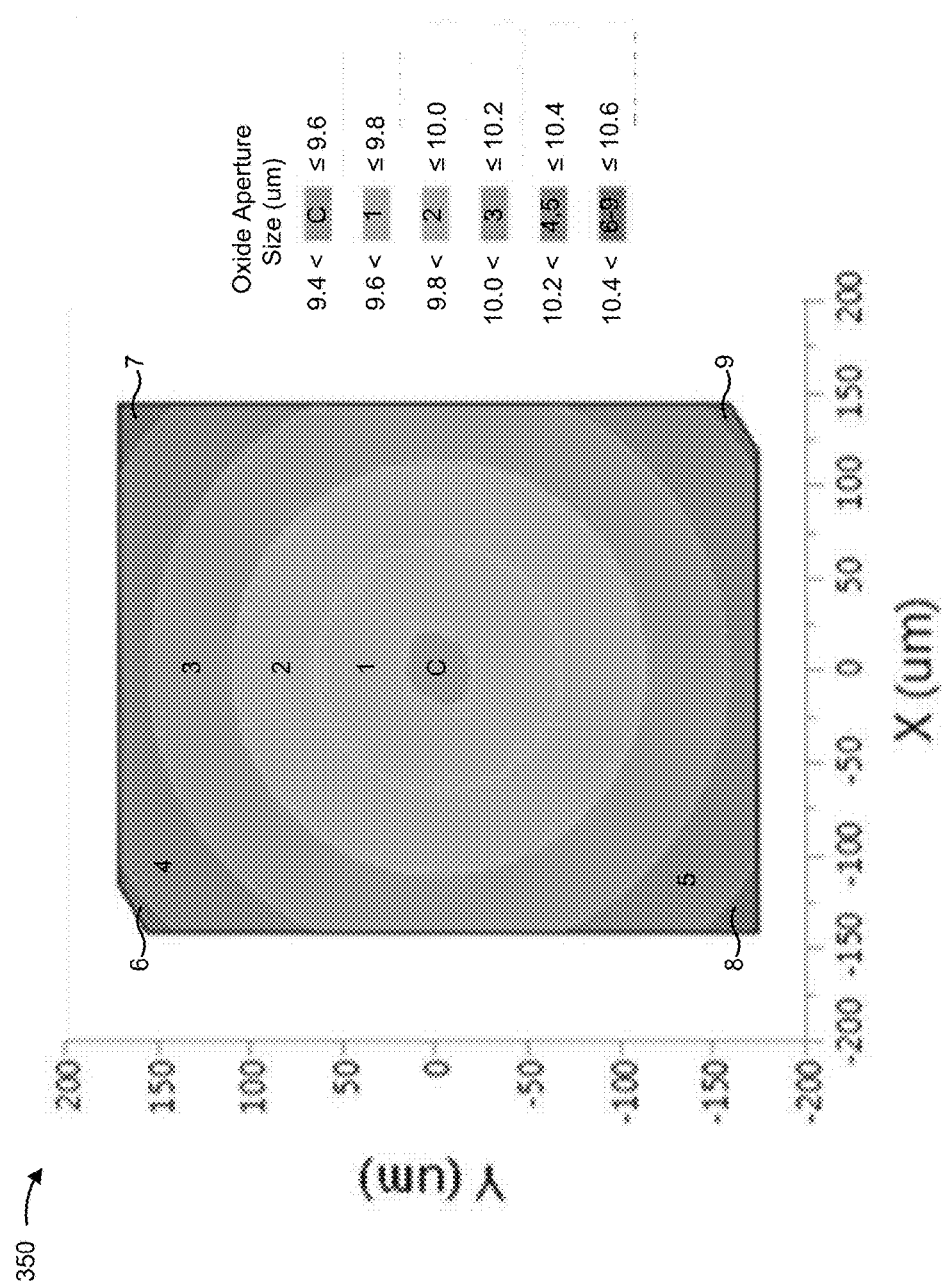

FIGS. 3A and 3B are diagrams associated with example emitter array 300 designed to reduce temperature non-uniformity across emitter array 300. FIG. 3A is a diagram of an example of a top-view of emitter array 300 that includes emitters 150 with emission areas of different sizes. The emission areas of emitters 150 may correspond to sizes of current confinement apertures 210 of the emitters 150, as described above. Notably, sizes of emission areas of emitters 150 and oxidation trenches 212 are exaggerated in FIG. 3A for illustrative purposes.

As shown, an emission area (corresponding to current confinement aperture 210) of emitter 150 at approximately a center of emitter array 300 may be smaller than emission areas of emitters 150 included in a first set of emitters 150 that surround the center emitter 150. As further shown, the emission areas of emitters 150 in the first set of emitters 150 may be smaller than emission areas of emitters 150 in a second set of emitters 150 (e.g., that surrounds the first set of emitters 150). Similarly, the emission areas of emitters 150 in the second set of emitters 150 may be smaller than emission areas of emitters 150 in a third set of emitters 150 (e.g., that surrounds the second set of emitters 150), and the emission areas of emitters 150 in the third set of emitters 150 may be smaller than emission areas of emitters 150 in a fourth set of emitters 150 (e.g., that surrounds the third set of emitters 150).

In other words, emission areas of emitters 150 may vary across emitter array 300 such that emitters 150 closer to the center of emitter array 300 have smaller emission areas than emission areas of emitters closer to edges of emitter array 300. As described above with regard to FIG. 2, the variation in emission area sizes may be caused by varying sizes of oxidation trenches 212. As described above with regard to FIG. 1, such variation in emission area sizes may reduce temperature non-uniformity across emitter array 300, thereby improving reliability of emitter array 300 and/or emitters 150 included in emitter array 300 (e.g., as compared to an emitter array including emitters 150 with emission areas of a same size). As described above, reducing the temperature non-uniformity may also improve the uniformity of the lasing wavelength across emitter array 300.

FIG. 3B is a diagram showing example sizes of current confinement apertures 210 of emitters 150 of an example emitter array 350 designed to reduce temperature non-uniformity. As described above, a size of current confinement aperture 210 may correspond to an emission area size of emitter 150. As shown in FIG. 3B, assume that emitter array 350 has a width (e.g., in an X direction) of approximately 300 microns (μm) and a length (e.g., in a Y direction) of approximately 350 μm. For the purposes of FIG. 3B, assume that each area, described below, includes multiple emitters 150 (i.e., details regarding individual emitters 150 are not shown in FIG. 3B).

As shown, a center area of emitter array 350 may include emitters 150 with current confinement apertures 210 that are approximately less than or equal to 9.6 μm in diameter. As further shown, a first area of emitter array 350, surrounding the center area of emitter array 350, may include emitters 150 with current confinement apertures 210 that are greater than approximately 9.6 μm and less than or equal to approximately 9.8 μm in diameter. As further shown, a second area of emitter array 350, surrounding the first area of emitter array 350, may include emitters 150 with current confinement apertures 210 that are greater than approximately 9.8 μm and less than or equal to approximately 10.0 μm in diameter. As shown, a third area of emitter array 350, surrounding the second area of emitter array 350, may include emitters 150 with current confinement apertures 210 that are greater than approximately 10.0 μm and less than or equal to approximately 10.2 μm in diameter. As further shown, a fourth area and a fifth area of emitter array 350, surrounding the third area of emitter array 350, may include emitters 150 with current confinement apertures 210 that are greater than approximately 10.2 μm and less than or equal to approximately 10.4 μm in diameter. As shown, a sixth area, a seventh area, an eighth area, and a ninth area of emitter array 350, surrounding the fourth and fifth areas of emitter array 350, may include emitters 150 with current confinement apertures 210 that are greater than approximately 10.4 μm and less than or equal to approximately 10.6 μm in diameter. Here, variation in sizes of current confinement apertures 210 may vary in order to reduce temperature non-uniformity during operation of emitter array 350.

As indicated above, FIGS. 3A and 3B are provided merely as examples. In practice, emitter array 300 may include additional emitters 150, fewer emitters 150, or differently arranged emitters 150 than those shown in FIG. 3A. For example, while emitter array 300 is shown as a grid array, in some implementations, emitter array 300 may be a non-grid array that includes unequally and/or randomly spaced emitters 150.

As another example, emitter array 300 is described as including emitters 150 with a constant rate of size variation (e.g., a 0.2 μm between each area), in some implementations, the rate of size variation may be smaller than 0.2 μm, larger than 0.2 μm, non-constant (e.g., for a single area, across multiple areas), or the like. In practice, the rate of size variation may depend on a design aspect of emitter array 300 (e.g., sizes of emitters 150, a pitch, a number of emitters 150, a substrate thickness), operating conditions associated with emitter array 300 (e.g., bias current, stage temperature), customer specifications (e.g., where an application has a requirement for minimum and/or maximum current confinement aperture 210 diameter), or the like.

Additionally, emitter array 300 and/or emitter array 350 may include additional and/or different variations, patterns, distributions, and/or sizes of emitters 150 and/or current confinement apertures 210 than those shown in FIGS. 3A and 3B.

Implementations described herein may provide an emitter array designed to improve reliability of an emitter array by reducing operating temperatures of emitters closer to a center of the emitter array (i.e., reduce temperature non-uniformity across the emitter array).

Figure 4A:
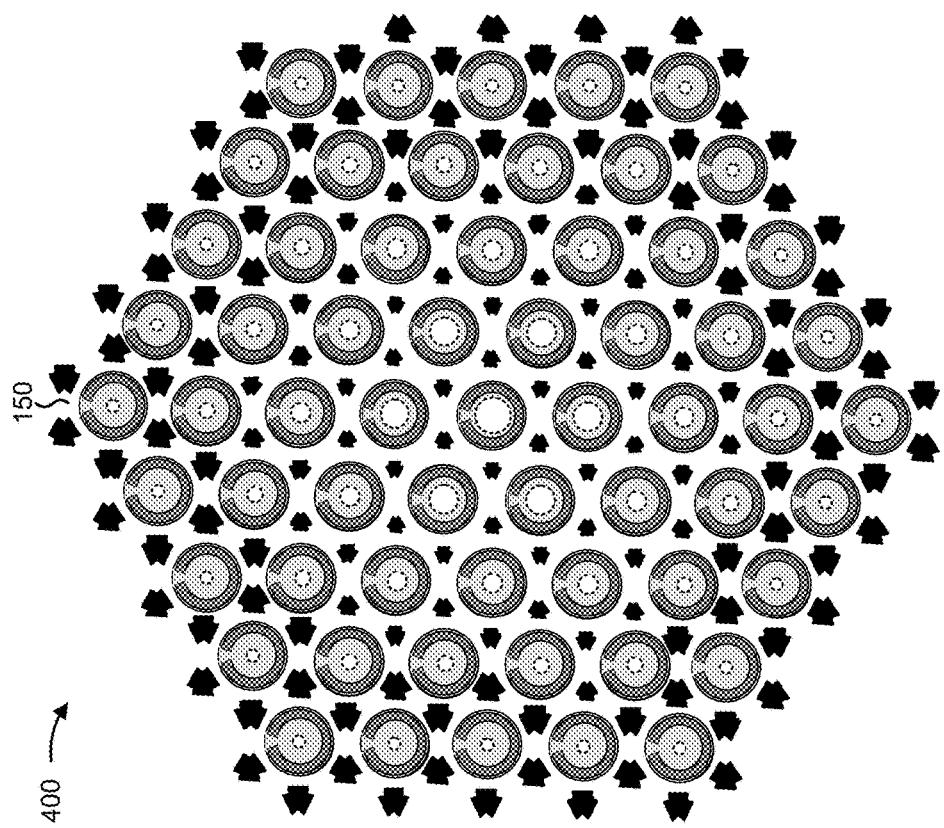
FIGS. 4A and 4B are diagrams associated with an example emitter array designed to reduce power non-uniformity in the example emitter array.
Figure 4B:
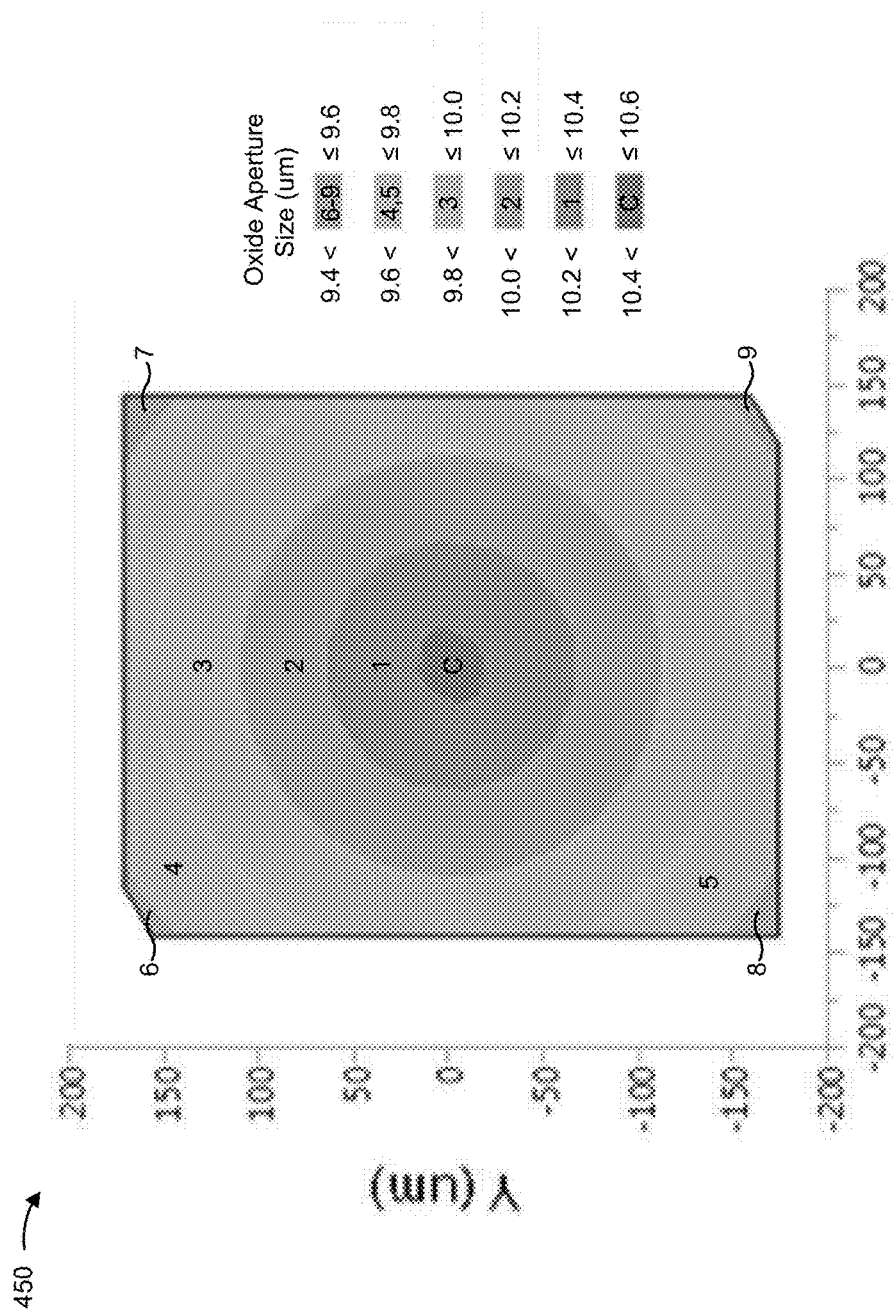

FIGS. 4A and 4B are diagrams associated with example emitter array 400 designed to reduce optical power non-uniformity across emitter array 400. FIG. 4A is a diagram of an example of a top-view of emitter array 400 that includes emitters 150 with emission areas of different sizes. The emission areas of emitters 150 may correspond to sizes of current confinement apertures 210 of the emitters 150, as described above. Notably, sizes of emission areas of emitters 150 and oxidation trenches 212 are exaggerated in FIG. 4A for illustrative purposes.

As shown, an emission area (corresponding to current confinement aperture 210) of emitter 150 at approximately a center of emitter array 400 may be larger than emission areas of emitters 150 included in a first set (e.g., a ring) of emitters 150 that surround the center emitter 150. As further shown, the emission areas of emitters 150 in the first set of emitters 150 may be larger than emission areas of emitters 150 in a second set of emitters 150 (e.g., that surrounds the first set of emitters 150). Similarly, the emission areas of emitters 150 in the second set of emitters 150 may be larger than emission areas of emitters 150 in a third set of emitters 150 (e.g., that surrounds the second set of emitters 150), and the emission areas of emitters 150 in the third set of emitters 150 may be larger than emission areas of emitters 150 in a fourth set of emitters 150 (e.g., that surrounds the third set of emitters 150).

In other words, emission areas of emitters 150 may vary across emitter array 400 such that emitters 150 closer to the center of emitter array 400 have larger emission areas than emission areas of emitters closer to edges of emitter array 400. As described above with regard to FIG. 2, the variation in emission area sizes may be caused by varying sizes of oxidation trenches 212. As described above with regard to FIG. 1, such variation in emission area sizes may reduce optical power non-uniformity across emitter array 400, thereby improving optical power output of emitter array 400 and/or emitters 150 included in emitter array 400 (e.g., as compared to an emitter array including emitters 150 with emission areas of a same size).

FIG. 4B is a diagram showing example sizes of current confinement apertures 210 included in emitters 150 of an example emitter array 450 designed to reduce optical power non-uniformity. As described above, a size of current confinement aperture 210 may correspond to an emission area size of emitter 150. As shown in FIG. 4B, assume that emitter array 450 has a width (e.g., in an X direction) of approximately 300 microns (μm) and a length (e.g., in a Y direction) of approximately 350 μm. For the purposes of FIG. 4B, assume that each area, described below, may include multiple emitters 150 (i.e., details regarding individual emitters 150 are not shown in FIG. 4B).

As shown, a center area of emitter array 450 may include emitters 150 with current confinement apertures 210 that are approximately less than or equal to 10.6 μm in diameter. As further shown, a first area of emitter array 450, surrounding the center area of emitter array 450, may include emitters 150 with current confinement apertures 210 that are approximately less than or equal to 10.4 μm in diameter. As further shown, a second area of emitter array 450, surrounding the first area of emitter array 450, may include emitters 150 with current confinement apertures 210 that are approximately less than or equal to 10.2 μm in diameter. As shown, a third area of emitter array 450, surrounding the second area of emitter array 450, may include emitters 150 with current confinement apertures 210 that are approximately less than or equal to 10.0 μm in diameter. As further shown, a fourth area and a fifth area of emitter array 450, surrounding the third area of emitter array 450, may include emitters 150 with current confinement apertures 210 that are approximately less than or equal to 9.8 μm in diameter. As shown, a sixth area, a seventh area, an eighth area, and a ninth area of emitter array 450, surrounding the fourth and fifth areas of emitter array 450, may include emitters 150 with current confinement apertures 210 that are approximately less than or equal to 9.6 μm in diameter. Here, variation in sizes of current confinement apertures 210 may vary in order to reduce optical power non-uniformity during operation of emitter array 450.

As indicated above, FIGS. 4A and 4B are provided merely as examples. In practice, emitter array 400 may include additional emitters 150, fewer emitters 150, or differently arranged emitters 150 than those shown in FIG. 4A. For example, while emitter array 400 is shown as a grid array, in some implementations, emitter array 400 may be a non-grid array that includes unequally and/or randomly spaced emitters 150.

As another example, emitter array 400 is described as including emitters 150 with a constant rate of size variation (e.g., a 0.2 μm between each area), in some implementations, the rate of size variation may be smaller than 0.2 μm, larger than 0.2 μm, non-constant (e.g., for a single area, across multiple areas), or the like. In practice, the rate of size variation may depend on a design aspect of emitter array 400 (e.g., sizes of emitters 150, a pitch, a number of emitters 150, a substrate thickness), operating conditions associated with emitter array 400 (e.g., bias current, stage temperature), customer specifications (e.g., where an application has a requirement for minimum and/or maximum current confinement aperture 210 diameter), or the like.

Additionally, emitter array 400 and/or emitter array 450 may include additional and/or different variations, patterns, distributions, and/or sizes of emitters 150 and/or current confinement apertures 210 than those shown in FIGS. 4A and 4B.

Notably, example emitter arrays 300 and 400 include emitters 150 that share oxidation trenches 212. However, in some implementations, one or more emitters 150 may not share oxidations 212 with other emitters 150 (e.g., an emitter 150 may have its own set of oxidation trenches 212). In such a case, a sizes of oxidation trenches 212 may be approximately equal in size, but an inner diameter (i.e., a position) of oxidation trenches 212 may vary. For example, a center emitter 150 may have oxidation trenches 212 with a first inner diameter (e.g., 30 μm), while emitter 150 near an edge may have oxidations trenches with a second inner diameter (e.g., 28 μm).

Furthermore, variation of sizes of current confinement apertures 210 is in one manner in which non-uniform current injection (i.e., causing different emitters 150 to consume different amounts of current) may be achieved among multiple emitters 150, but other techniques may be possible. For example, in some implementations, variations in implant protection layer 202 may be used to achieve non-uniform current injection among emitters 150. As another example, in the case of non-oxide VCSELs, sizes of current injection layers of the non-oxide VCSELs may be varied to achieve non-uniform current injection.

Implementations described herein may provide an emitter array designed to improve optical power of an emitter array by increasing optical power of emitters closer to a center of the emitter array (i.e., reduce power non-uniformity across the emitter array).

The foregoing disclosure provides illustration and description, but is not intended to be exhaustive or to limit the implementations to the precise form disclosed. Modifications and variations are possible in light of the above disclosure or may be acquired from practice of the implementations. For example, while the techniques described herein are described in the context of oxide confined VCSELs, in some implementations, these techniques may be used for another type of VCSEL architecture, such as a non-oxide VCSEL (i.e., these techniques are not limited to oxide confined VCSELs). Examples of such VCSELs include VCSELs that use current confinement by an etched-pillar, by ion-implantation, by selective re-growth of a tunnel-junction, by dopant diffusion over selective regions of the device and re-growth, or the like. The techniques described herein may also be applied to VCSELs arrays emitting through the epitaxial substrate and flip-chip mounted VCSEL arrays.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A vertical cavity surface emitting laser (VCSEL) array, comprising:
   a plurality of uniformly spaced VCSELs,
   where a size of an emission area of a first VCSEL, of the plurality of VCSELs, is different from a size of an emission area of a second VCSEL of the plurality of VCSELs,
   the first VCSEL being located closer to a center of the VCSEL array than the second VCSEL,
   where a difference between the size of the emission area of the first VCSEL and the size of the emission area of the second VCSEL is associated with reducing a difference in operating temperature between the first VCSEL and the second VCSEL, or reducing a difference in optical power output between the first VCSEL and the second VCSEL,
   where the first VCSEL includes a plurality of oxidation trenches and at least one oxidation trench, of the plurality of oxidation trenches, is shared by the second VCSEL,
   where the second VCSEL includes at least one other oxidation trench that has a size that is different than a size of the shared at least one oxidation trench,
   where the size of the at least one other oxidation trench is inversely proportional to the size of the emission area of the second VCSEL, and
   where a difference in size between the plurality of oxidation trenches of the first VCSEL and the second VCSEL has an opposite relationship to a difference in the size of the emission area between the first VCSEL and the second VCSEL.

2. The VCSEL array of claim 1, where a size of a current confinement aperture of the first VCSEL is different than a size of a current confinement aperture of the second VCSEL,
   the size of the current confinement aperture of the first VCSEL corresponding to the size of the emission area of the first VCSEL, and
   the size of the current confinement aperture of the second VCSEL corresponding to the size of the emission area of the second VCSEL.

3. The VCSEL array of claim 2, where the size of the current confinement aperture of the first VCSEL and the size of the current confinement aperture of the second VCSEL are between approximately 6 microns and 14 microns.

4. The VCSEL array of claim 1, where a distance between a first pair of oxidation trenches, associated with the first VCSEL, is different than a distance between a second pair of oxidation trenches associated with the second VCSEL.

5. The VCSEL array of claim 1, where the size of the emission area of the first VCSEL is smaller than the size of the emission area of the second VCSEL.

6. The VCSEL array of claim 5, where temperature non-uniformity among the plurality of VCSELs is reduced as compared to a VCSEL array comprising VCSELs with emission areas of a substantially same size.

7. The VCSEL array of claim 1, where the size of the emission area of the first VCSEL is larger than the size of the emission area of the second VCSEL.

8. The VCSEL array of claim 7, where optical power non-uniformity among the plurality of VCSELs is reduced as compared to a VCSEL array comprising VCSELs with emission areas of a substantially same size.

9. The VCSEL array of claim 1, where each VCSEL, of the plurality of VCSELs, is to produce a laser with a substantially same wavelength.

10. An emitter array, comprising:
    a plurality of uniformly spaced emitters, where an emission area size of a first emitter, of the plurality of emitters, is different from an emission area size of a second emitter of the plurality of emitters,
the first emitter being located closer to an edge of the emitter array than the second emitter,
where a difference between the emission area size of the first emitter and the emission area size of the second emitter is associated with improving reducing operating temperature non-uniformity between the first emitter and the second emitter or reducing optical power non-uniformity between the first emitter and the second emitter,
where the first emitter includes a plurality of oxidation trenches and at least one oxidation trench, of the plurality of oxidation trenches, is shared by the second emitter,
where the second emitter includes at least one other oxidation trench that has a size that is different than a size of the shared at least one oxidation trench,
where the size of the at least one other oxidation trench is inversely proportional to the emission area size of the second emitter, and
where a difference in size between the plurality of oxidation trenches of the first emitter and the second emitter has an opposite relationship to a difference in the emission area size between the first emitter and the second emitter.

11. The emitter array of claim 10, where an aperture size of the first emitter is different than an aperture size of the second emitter,
the aperture size of the first emitter corresponding to the emission area size of the first emitter, and
the aperture size of the second emitter corresponding to the emission area size of the second emitter.

12. The emitter array of claim 10, where the emission area size of the first emitter is smaller than the emission area size of the second emitter.

13. The emitter array of claim 10, where the emission area size of the first emitter is larger than the emission area size of the second emitter.

14. The emitter array of claim 10, where sizes of a first pair of oxidation trenches, associated with the first emitter, are different than sizes of a second pair of oxidation trenches associated with the second emitter.

15. The emitter array of claim 10, where an emission area size of a third emitter, of the plurality of emitters, is different from the emission area size of the first emitter and is different from the emission area size of the second emitter,
the third emitter being located closer to the edge of the emitter array than the first emitter and being located closer to the edge of the emitter array than the second emitter.

16. A laser array of uniform emitter spacing, comprising:
a first vertical emitting device,
the first vertical emitting device having an emission area of a first size; and
a second vertical emitting device,
the second vertical emitting device having an emission area of a second size,
the second size being larger than the first size, or the second size being smaller than the first size,
the first vertical emitting device being located closer to a center of the laser array than the second vertical emitting device,
a difference between the first size and the second size being related to reducing operating temperature non-uniformity between the first vertical emitting device and the second vertical emitting device, or reducing optical power non-uniformity between the first vertical emitting device and the second vertical emitting device,
the first vertical emitting device including a plurality of oxidation trenches and at least one oxidation trench, of the plurality of oxidation trenches, being shared by the second vertical emitting device,
the second vertical emitting device includes at least one other oxidation trench that has a size that is different than a size of the shared at least one oxidation trench,
where the size of the at least one other oxidation trench is inversely proportional to the emission area of the second vertical emitting device, and
where a difference in size between the plurality of oxidation trenches of the first vertical emitting device and the second vertical emitting device has an opposite relationship to a difference in the emission area between the first vertical emitting device and the second vertical emitting device.

17. The laser array of claim 16, where a size of a first current confinement aperture of the first vertical emitting device and a size of a second current confinement aperture of the second vertical emitting device are in a range from approximately 6 microns to approximately 14 microns,
the size of the first current confinement aperture corresponding to the first size, and
the size of the second current confinement aperture corresponding to the second size.

18. The laser array of claim 16, where the second size is larger than the first size, and
where the temperature non-uniformity between the first vertical emitting device and the second vertical emitting device is reduced as compared to a laser array comprising vertical emitting devices with emission areas of a substantially same size.

19. The laser array of claim 16, where the second size is smaller than the first size, and
where the optical power non-uniformity between the first vertical emitting device and the second vertical emitting device is reduced as compared to a laser array comprising vertical emitting devices with emission areas of a substantially same size.

* * * * *